US009467170B2

(12) United States Patent
Chilappagari et al.

(10) Patent No.: US 9,467,170 B2
(45) Date of Patent: Oct. 11, 2016

(54) NAND FLASH MEMORY SYSTEMS WITH EFFICIENT SOFT INFORMATION INTERFACE

(71) Applicant: Marvell World Trade LTD., St. Michael (BB)

(72) Inventors: Shashi Kiran Chilappagari, San Jose, CA (US); Gregory Burd, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 215 days.

(21) Appl. No.: 14/267,307

(22) Filed: May 1, 2014

(65) Prior Publication Data
US 2014/0344647 A1    Nov. 20, 2014

Related U.S. Application Data

(60) Provisional application No. 61/824,822, filed on May 17, 2013.

(51) Int. Cl.
*H03M 13/11* (2006.01)
*H03M 13/37* (2006.01)
(Continued)

(52) U.S. Cl.
CPC ....... *H03M 13/1111* (2013.01); *G06F 11/1012* (2013.01); *G06F 11/1048* (2013.01);
(Continued)

(58) Field of Classification Search
CPC ........... G06F 11/1012; G06F 11/1068; G06F 11/1048; H03M 13/1108; H03M 13/3707; H03M 13/1111; H03M 13/2957; H03M 13/3746; H03M 13/41; H03M 13/45; H03M 13/1105; H03M 13/2927; H03M 13/2975; H03M 13/3738; H03M 13/3927; H03M 13/458; H03M 13/6513; G11C 29/52
USPC ........ 714/E11.032, 752, 755, 780, 763, 782, 714/758, 773, 786, 799, 800
See application file for complete search history.

(56) References Cited

U.S. PATENT DOCUMENTS

2008/0052609 A1*  2/2008  Peng ................. H03M 13/1515
                                                                      714/799
2012/0198314 A1*  8/2012  Yang ................... G06F 11/1012
                                                                      714/782

(Continued)

OTHER PUBLICATIONS

Micron Technical Note; TN-29-63: Error Correction Code (ECC) in SLC NAND Introduction; Error Correction Code (ECC) in Micron © Single-Level Cell (SLC) NAND; Micron Technology, Inc.; Copyright © 2011; 12 pages.

*Primary Examiner* — John J Tabone, Jr.

(57) ABSTRACT

A controller for a nonvolatile memory device includes a transfer control module and a decoder module. The transfer control module is configured to request a read of data from a flash memory module. The data to be read includes data corresponding to a first codeword. The transfer control module is configured to receive hard decisions corresponding to the first codeword from the flash memory module. The transfer control module is configured to receive soft information corresponding to the first codeword from the flash memory module. Both the hard decisions corresponding to the first codeword and the soft information corresponding to the first codeword are received without receiving any intervening hard decisions or soft information corresponding to another codeword. The decoder module is configured to decode the first codeword using the hard decisions and the soft information corresponding to the first codeword.

23 Claims, 21 Drawing Sheets

(51) Int. Cl.
    *H03M 13/29*    (2006.01)
    *H03M 13/41*    (2006.01)
    *H03M 13/45*    (2006.01)
    *H03M 13/39*    (2006.01)
    *G11C 29/52*    (2006.01)
    *G06F 11/10*    (2006.01)
    *H03M 13/00*    (2006.01)

(52) U.S. Cl.
    CPC ........... *G06F11/1068* (2013.01); *G11C 29/52* (2013.01); *H03M 13/1105* (2013.01); *H03M 13/1108* (2013.01); *H03M 13/2927* (2013.01); *H03M 13/2957* (2013.01); *H03M 13/2975* (2013.01); *H03M 13/3707* (2013.01); *H03M 13/3738* (2013.01); *H03M 13/3746* (2013.01); *H03M 13/3927* (2013.01); *H03M 13/41* (2013.01); *H03M 13/45* (2013.01); *H03M 13/458* (2013.01); *H03M 13/6513* (2013.01)

(56) References Cited

U.S. PATENT DOCUMENTS

| | | | |
|---|---|---|---|
| 2013/0007561 A1* | 1/2013 | Motwani | H03M 13/1102 714/758 |
| 2013/0117640 A1* | 5/2013 | Tai | G06F 11/1048 714/780 |
| 2013/0132804 A1* | 5/2013 | Frayer | G06F 11/1012 714/780 |
| 2013/0145229 A1* | 6/2013 | Frayer | G06F 11/1012 714/755 |
| 2013/0145231 A1* | 6/2013 | Frayer | G06F 11/1012 714/763 |
| 2014/0089767 A1* | 3/2014 | Chang | H03M 13/1108 714/780 |
| 2014/0149825 A1* | 5/2014 | Motwani | H03M 13/3723 714/764 |
| 2014/0229792 A1* | 8/2014 | Varnica | H03M 13/1108 714/759 |
| 2014/0258809 A1* | 9/2014 | Nguyen | H03M 13/1111 714/763 |
| 2014/0281788 A1* | 9/2014 | Nguyen | H03M 13/1108 714/752 |
| 2014/0289584 A1* | 9/2014 | Chilappagari | G06F 11/1068 714/755 |
| 2014/0325237 A1* | 10/2014 | Van Der Leest | G06F 21/72 713/189 |
| 2015/0278015 A1* | 10/2015 | Haratsch | G06F 11/1012 714/764 |

* cited by examiner

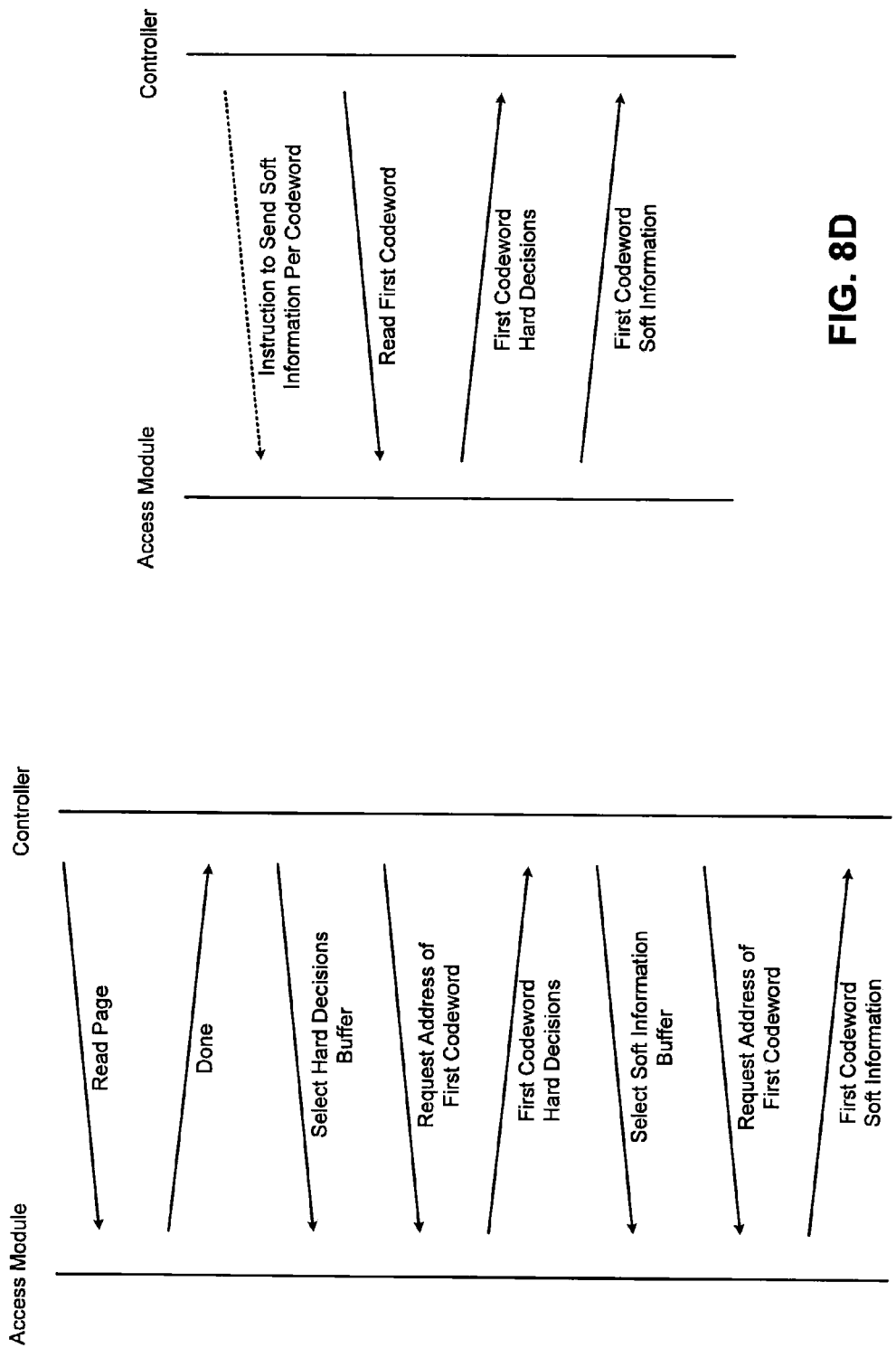

NAND FLASH MEMORY SYSTEMS WITH EFFICIENT SOFT INFORMATION INTERFACE

CROSS-REFERENCE TO RELATED APPLICATIONS

This application claims the benefit of U.S. Provisional Application No. 61/824,822, filed on May 17, 2013. The entire disclosure of the application referenced above is incorporated herein by reference.

FIELD

The present disclosure relates to nonvolatile memory and more particularly to data transfer interface in a controller/flash interface.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In FIG. 1, a system 100 includes a flash system 104 that communicates with a host 108. The flash system 104 includes a flash device 112 and a controller 116. The flash device 112 includes a storage array 120 and an access module 124. The storage array 120 includes flash systems such as NAND flash cells. The access module 124 is responsible for performing writes and reads to the storage array 120, while the controller 116 is configured to respond to requests by the host 108 and manage higher-level functionality of the flash device 112, such as wear leveling.

In FIG. 2, a flowchart shows operation of the flash system 104 in response to a request from the host 108. Control begins at 204, where a page is read from the flash device. At 208, hard decisions from the page corresponding to the read request are sent to the controller. At 210, control decides whether a transmission retry is needed. If so, control transfers to 212 to send soft information corresponding to the read request to the controller, and control then continues at 216. While hard decisions indicate whether each of the cells appears to have stored a 0 or a 1, soft information indicates how likely it is that that the 0/1 determination was correct. The soft information may take time to be gathered, and therefore is not sent immediately following the hard decisions.

If a retry is not needed at 210, control continues at 216. In many prior art systems, elements 210 and 212 are not present, and no soft information is sent to the controller. Control therefore proceeds from 208 directly to 216. At 216, once the controller has all of the hard decisions, and potentially some soft information, the controller decodes the data and performs error correction. At 220, control sends the data to the host as a response to the read request.

In FIG. 3, a graphical representation of the order of transfer of data in response to a read is shown. The access module 124 first sends the hard decisions for the page, and then sends the soft information for the page. In various implementations, the hard decisions may be sent after performing a first read of the storage array 120, and the soft information may be sent in response to performing further reads of the storage array 120. For example, soft information may be obtained by adjusting thresholds used to read the contents of the storage array 120.

SUMMARY

A controller for a nonvolatile memory device includes a transfer control module and a decoder module. The transfer control module is configured to request a read of data from a flash memory module. The data to be read includes data corresponding to a first codeword. The transfer control module is configured to receive hard decisions corresponding to the first codeword from the flash memory module. The transfer control module is configured to receive soft information corresponding to the first codeword from the flash memory module. Both the hard decisions corresponding to the first codeword and the soft information corresponding to the first codeword are received without receiving any intervening hard decisions or soft information corresponding to another codeword. The decoder module is configured to decode the first codeword using the hard decisions and the soft information corresponding to the first codeword.

In other features, the decoder module is configured to begin decoding the first codeword prior to the transfer control module completing reception of hard decisions and soft information corresponding to a second codeword, wherein the second codeword is immediately subsequent to the first codeword. In other features, the controller includes a buffer configured to store the hard decisions corresponding to the first codeword and the soft information corresponding to the first codeword, wherein a size of the buffer is smaller than a size of all hard decisions for a page of data.

In other features, the decoder module is configured to begin decoding the first codeword after (i) the hard decisions corresponding to the first codeword and (ii) the soft information corresponding to the first codeword are received. In other features, the transfer control module is configured to select a hard decision buffer of the flash memory module prior to receiving the hard decisions corresponding to the first codeword and select a soft information buffer of the flash memory module prior to receiving soft information corresponding to the first codeword.

In other features, the transfer control module is configured to request data from the flash memory module at an address corresponding to the hard decisions of the first codeword, and request data from the flash memory module at an address corresponding to the soft information of the first codeword. In other features, the transfer control module is configured to instruct the flash memory module to transmit both hard decisions of a codeword and soft information of the codeword together without transmitting any intervening hard decisions or soft information corresponding to another codeword.

A nonvolatile memory device includes a storage array of nonvolatile memory cells, a buffer, and an access control module. The nonvolatile memory cells are grouped into pages. The access control module is configured to selectively write data to the selected page or read data from the selected page into the buffer. Reading data from the selected page includes making hard decisions about states of nonvolatile memory cells in the selected page, acquiring soft information about the states of the nonvolatile memory cells in the selected page, and storing the hard decisions and the soft information into the buffer. The selected page includes data corresponding to a plurality of codewords. The access control module is further configured to, for each codeword of the plurality of codewords, output the hard decisions corresponding to the codeword along with any soft information corresponding to the codeword without outputting any intervening hard decisions or soft information for any other ones of the plurality of codewords.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIGS. 8A-8E are example communication sequences between an access module and a controller.

In the drawings, reference numbers may be reused to identify similar and/or identical elements.

DESCRIPTION

Figure 1:
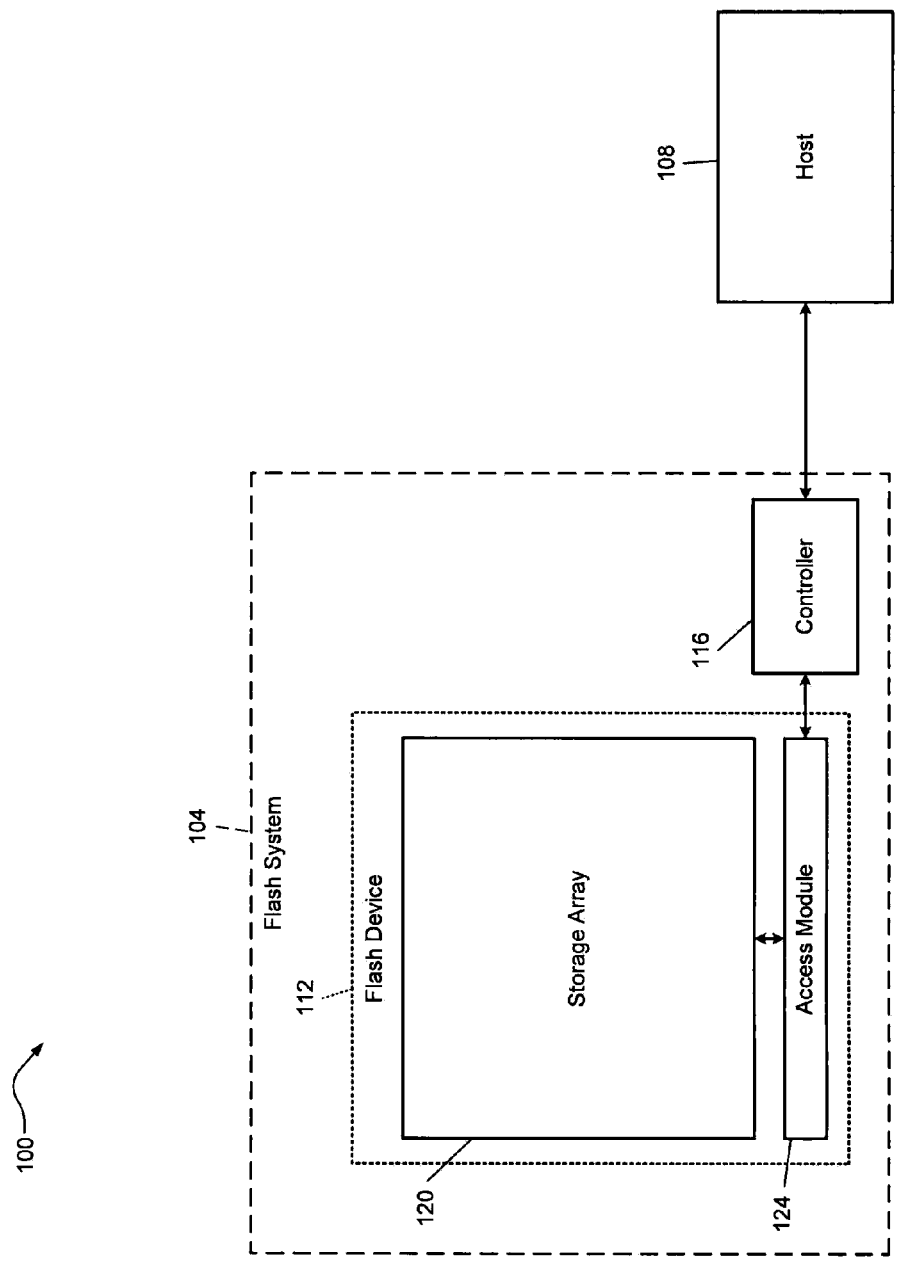
FIG. 1 is a functional block diagram of a flash memory system according to the prior art.
Figure 2:
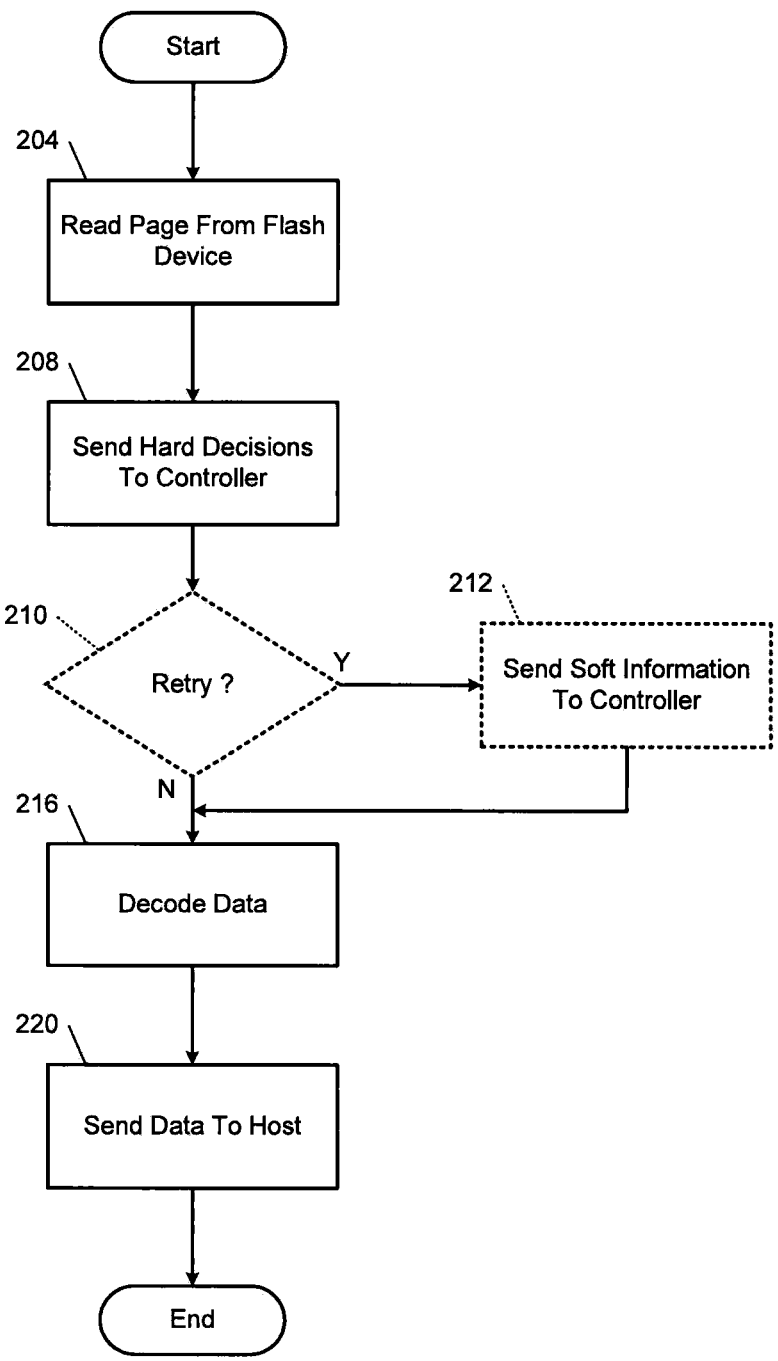
FIG. 2 is a flowchart of read operation according to the prior art.
Figure 3:
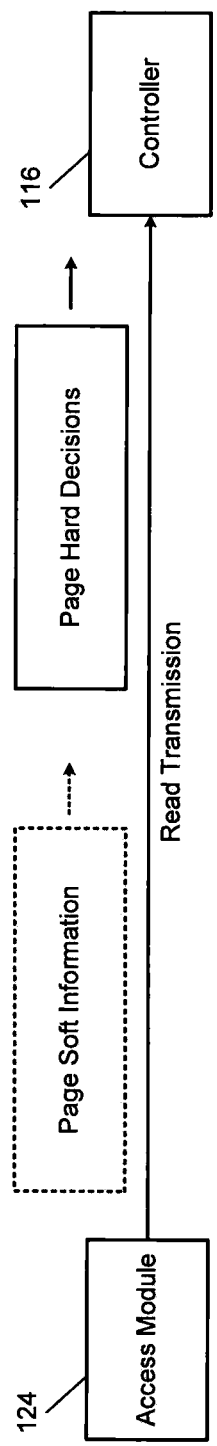
FIG. 3 is a graphical depiction of data transfer according to the prior art.
Figure 4:
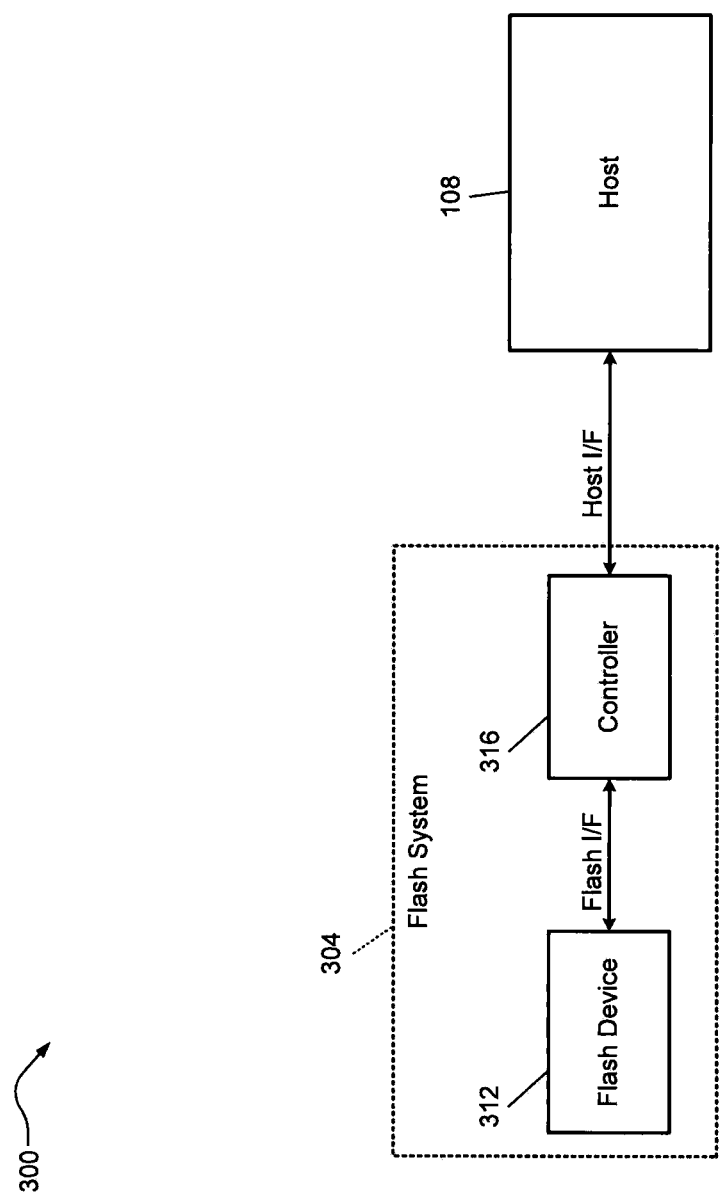
FIG. 4 is a functional block diagram of a flash memory system according to the principles of the present disclosure.

In FIG. 4, a flash memory system 300 includes a flash system 304 and the host 108. For example, the flash system 304 may include or be part of an SSD (solid state drive) and/or a hybrid hard drive cache. The host 108 may be a general purpose processor, a bus controller, a RAID (Redundant Array of Inexpensive Disks) controller, etc. The flash system 304 and the host 108 communicate using a host interface. For example only, the host interface may be PCI (Peripheral Component Interconnect), PCIe (PCI Express), SCSI (Small Computer Systems Interface), SAS (Serial Attached SCSI), or SATA (Serial Advanced Technology Attachment).

The flash system 304 includes a flash device 312 and a controller 316. The flash device 312 and the controller 316 communicate using a flash interface. The flash interface may be standardized so that the flash device 312 and the controller 316 can be sourced from different manufactures and yet still interoperate. For example only, the flash interface may be partially or fully compliant with ONFI (Open NAND Flash Interface), Toggle Mode, and/or Toggle V2.0.

The flash device 312 includes flash storage cells, such as NAND or NOR flash storage cells. The flash device 312 may have low-level read, write, and erase functionality, while the controller 316 may implement higher level functionality, such as wear leveling and logical/physical address translation.

The flash device 312 may include single-level cells, where each flash cell stores either a 0 or a 1, and/or may include multi-level cells, where each flash cell can store three or more values. Although described in this application in the context of flash memory, the flash system 304 may alternatively be another type of nonvolatile device, and the flash device 312 may be a general nonvolatile device including nonvolatile storage elements. For example only, the nonvolatile storage elements may include magnetoresistive memory, holographic memory, ferroelectric memory, resistive memory, phase-change memory, etc.

The controller 316 may use FEC (forward error correction), also known as ECC (error-correction coding), on data to be written to the flash device 312. This may detect errors introduced while the data is being transferred to or stored in the flash device 312, and may allow for some errors to be corrected. The ECC may be applied to a portion of data having a predetermined size, where that portion is known as a codeword. For example only, the codeword size may be 512 bytes, 1 kilobyte, 2 kilobytes, or 4 kilobytes. The ECC algorithm may include a BCH (Bose-Chaudhuri-Hocquenghem) algorithm, a RS (Reed-Solomon) algorithm, a Hamming algorithm, a Viterbi algorithm, or an LDPC (low-density parity-check) algorithm. The soft information may include LLR (log-likelihood ratio) information.

The controller 316 may perform operations at the codeword level or at an allocation unit level. An allocation unit is one or more codewords. The flash device 312, meanwhile, may operate on a portion of data of a different predetermined size, called a page. Making the page size smaller may require more circuitry and more physical area for additional electrical traces. Therefore, the page size may be larger than the codeword size. For example only, the page size may be 16 kilobytes, 32 kilobytes, 64 kilobytes, or 128 kilobytes. The flash device 312 may be constrained to erase an entire block of data in order to erase any portion of the block. Each block may include one or more pages.

Because the flash device 312 performs a read of an entire page, but the ECC is performed per codeword, it may be more efficient for the controller 316 to receive all the data corresponding to a single codeword at once so that processing of that codeword can begin as soon as possible. For example, when the flash device 312 retrieves hard decisions and soft information (also known as soft decision data) from the storage cells of a page, the hard decisions and soft information for a single codeword may be sent back to back to the controller 316 together without any intervening data from other codewords. In that way, the controller 316 can begin processing a first codeword immediately.

This in contrast to prior art systems, where all of the hard decisions for all of the codewords in a page are sent first and sometimes followed by, after some delay, soft information for the codewords. In those prior art systems, additional latency is introduced as the controller waits for all of the hard decisions to be received, followed by the soft information for the first codeword before the controller can begin decoding the first codeword.

Figure 5A:
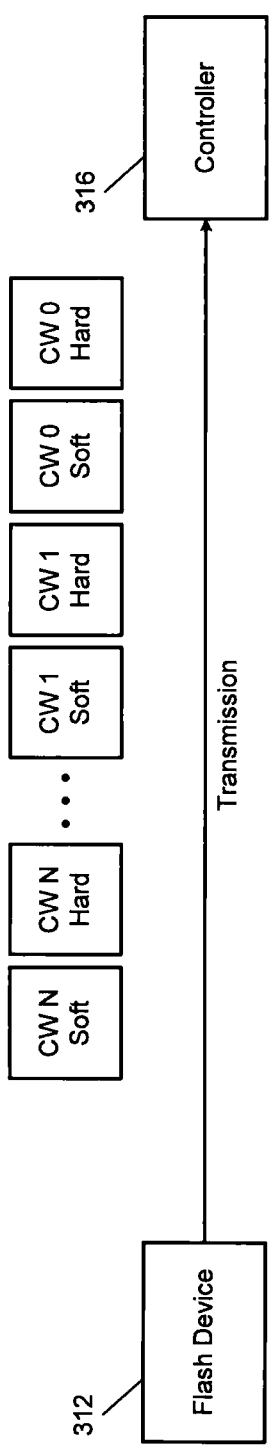
FIGS. 5A-5D are graphical depictions of example data transfer between a flash device and controller.

In FIG. 5A, a graphical example of transmission order of codeword data according to the present disclosure is shown. The flash device 312 transmits the hard decisions for codeword 0 to the controller 316, followed by the soft information for codeword 0. At this point, the controller 316 has all of the information necessary to begin decoding codeword 0. The flash device 312 then sends the hard decisions for codeword 1 and the soft information for codeword 1. The controller 316 can then begin decoding the codeword 1. The flash device 312 continues sending alternating hard decisions and soft information until the final codeword, codeword N, is reached. For example, the controller 316 may have originally requested a read with a length of N+1 codewords.

The controller 316 may be able to process codewords in real-time—that is, the controller 316 can process codeword 0 by the time codeword 1 has been fully received. Therefore, a size of a buffer in the controller 316 may be significantly reduced in some implementations compared to the prior art. In the prior art, all of the hard decisions from a page are buffered and, in some implementations, soft information is also received.

In addition to reducing the size of the buffer, this transmission order may also allow for a reduction in latency, as the data can be provided to the host on a codeword level so that as soon as each codeword is decoded, the decoded codeword is forwarded to the host. In other implementations, the decoded codewords may be queued, and the queued decoded codewords can be sent to the host in groups. When these groups are smaller than a page size, latency for those initial groups may be less than in the prior art.

Figure 5B:
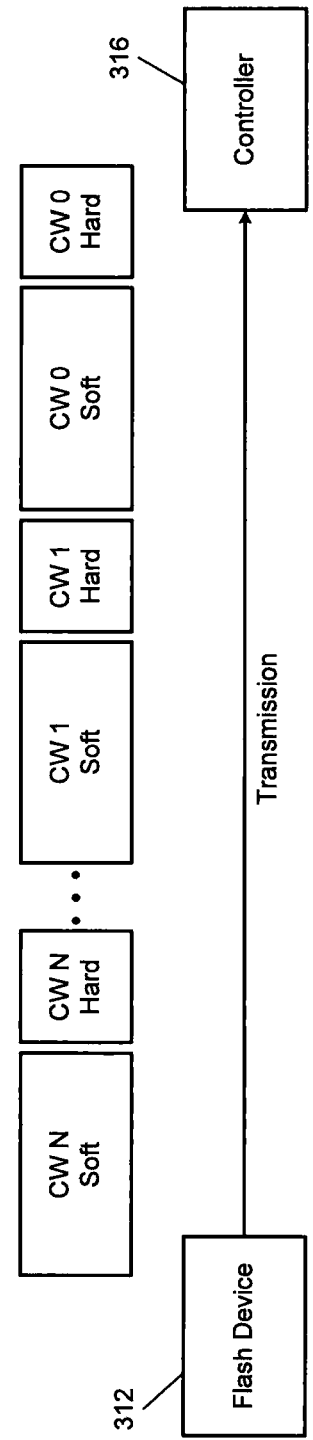

In FIG. 5B, the quantity of soft information is depicted as being larger than the quantity of hard decisions. For example, in a single-level cell, the hard decision may simply be a choice between 0 and 1 (a single bit). Soft information may be a single bit as in FIG. 5A, indicating reliability of that hard decision. As shown in FIG. 5B, however, the soft information may be two or more bits that indicate the quality of the hard decision.

For example only, if a hard decision is based on a read value for a memory cell being above or below a threshold in the middle of an expected range, the soft information may correspond to a threshold set at one quarter of the expected range and a threshold set at three quarters of the expected range. This may result in two bits of soft information to accompany the hard decision. Readings from the cell that are greater than the one quarter threshold and less than the three quarter threshold may be more likely to have crossed the middle threshold during storage, thereby indicating that the hard decision is less reliable.

Figure 5C:
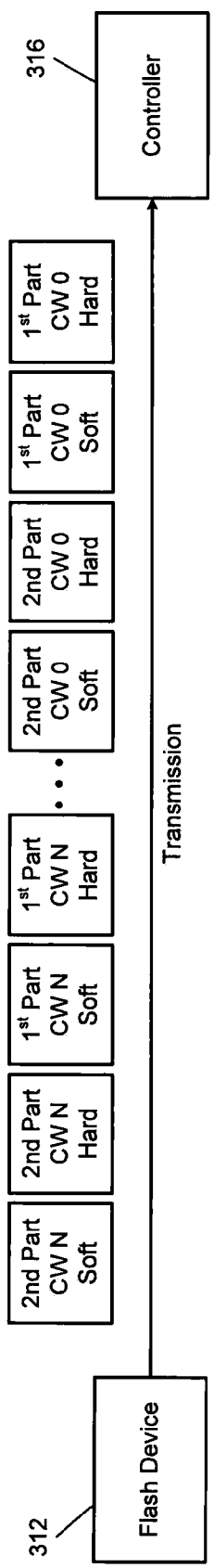

In FIG. 5C, a graphical depiction of splitting of the hard decision and soft information of a codeword is shown. The flash device 312 may not send all of the hard decisions for a single codeword at once. Instead, the flash device 312 may transmit hard decisions with a smaller granularity. In FIG. 5C, as an example only, half of the hard decisions are sent at a time, followed by the corresponding soft information, then the second half of the hard decisions and soft information for the codeword is sent. The hard decisions and soft information can be split into any number and size of parts and sent in any order as long as all of the hard decisions and soft information are received for a first codeword before hard decisions or soft information from a second codeword are sent. This allows processing of the first codeword to begin as soon as possible.

Figure 5D:
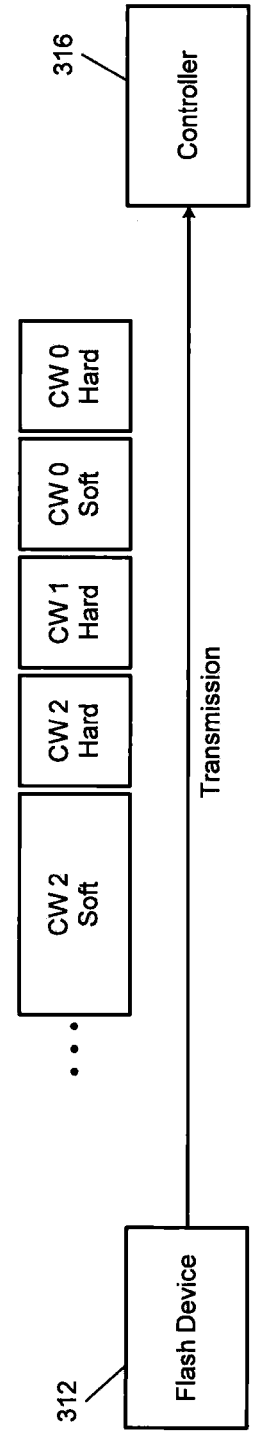

In FIG. 5D, a graphical depiction of an implementation where variable amounts of soft information are transmitted. The flash device 312 may signal to the controller 316 which of the hard decisions will be followed by soft information, and may indicate how much soft information is to follow. As an example only, in FIG. 5D, soft information for the first codeword (CW 0) is sent following the hard decisions, while no soft information is sent for the second codeword (CW 1). Meanwhile, more soft information is sent for the third codeword (CW 2) than for the first codeword.

Figure 6A:
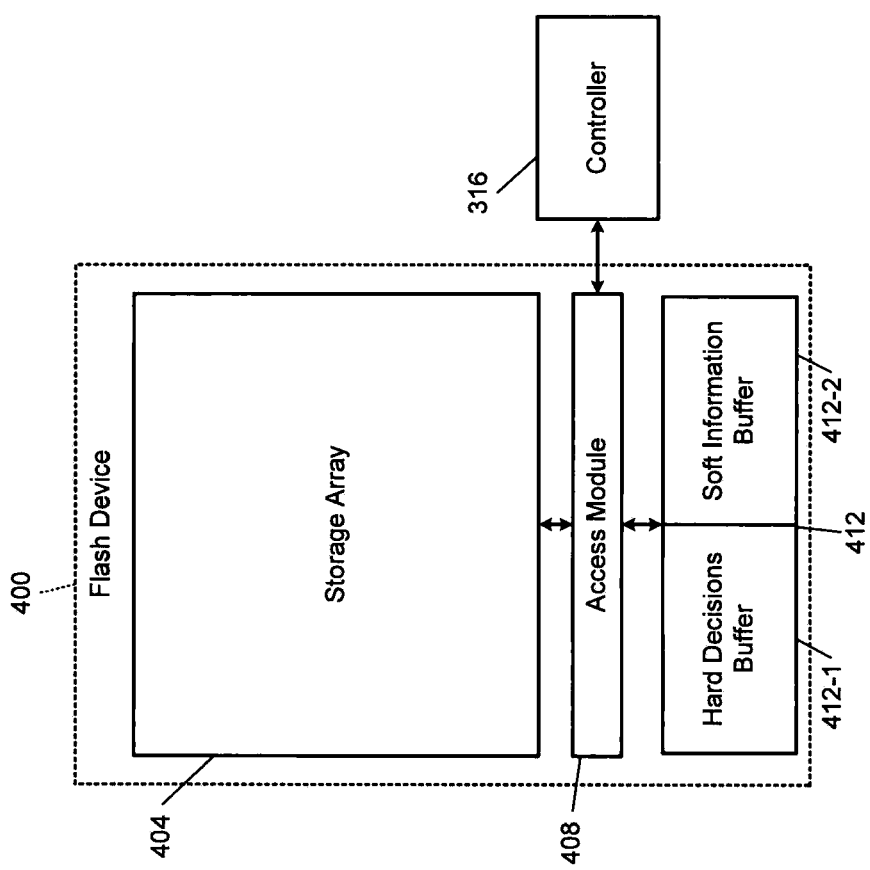
FIGS. 6A-6D are functional block diagrams of example implementations of a flash system.

In FIG. 6A, an example implementation of a flash device 400 includes a storage array 404, an access module 408, and a buffer 412. The buffer 412 may be split into a portion for hard decisions 412-1 and a portion for soft information 412-2. The access module 408 reads pages of data from the storage array 404 into the buffer 412 based on requests from the controller 316. The access module 408 may also write data to the storage array 404 based on requests from the controller 316. In various implementations, the buffer 412 may also be used to store data that is to be written to the storage array 404.

As discussed in more detail below, the access module 408 outputs hard decisions from the hard decision buffer 412-1 and soft information from the soft information buffer 412-2 for a first codeword before sending the hard decisions and soft information for a second codeword. This behavior may be explicitly controlled by the controller 316. Alternatively, the access module 408, either by default or based on a setting or configuration parameter, may send the hard decisions and soft information according to one of the orders shown in FIGS. 5A-5D.

Figure 6B:
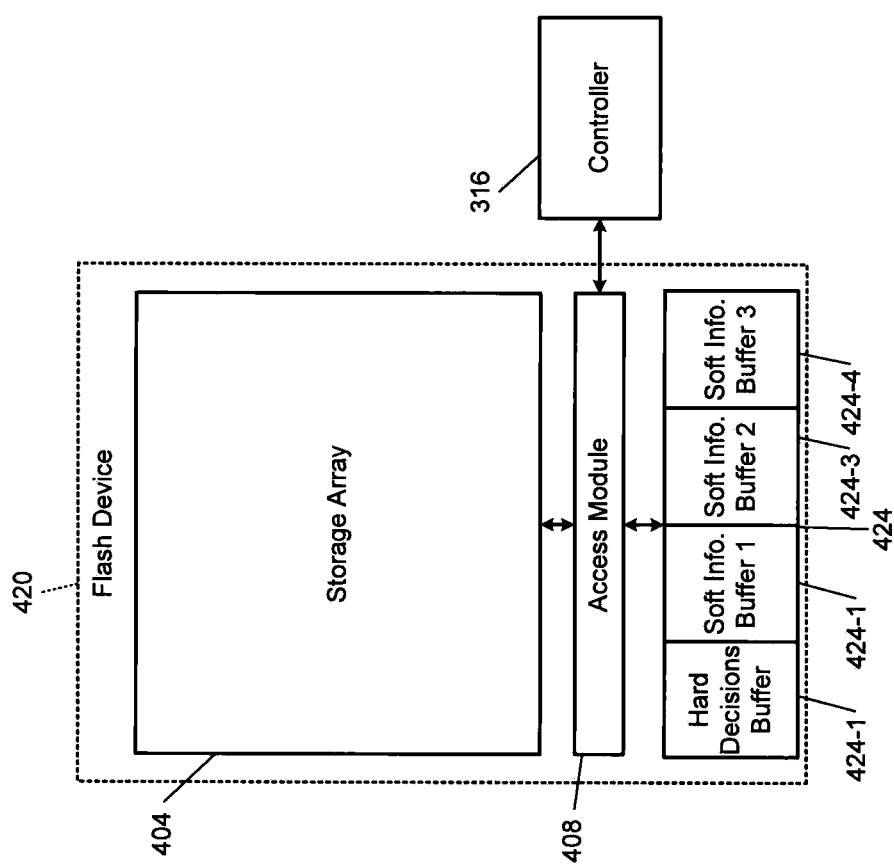

In FIG. 6B, another example of flash device 420 includes a buffer 424 that is segmented into a hard decision buffer 424-1, a first soft information buffer 424-2, a second soft information buffer 242-3, and a third soft information buffer 424-4. The buffer 424 may be segmented this way when there are three bits of soft information for every one hard decision bit.

Figure 6C:
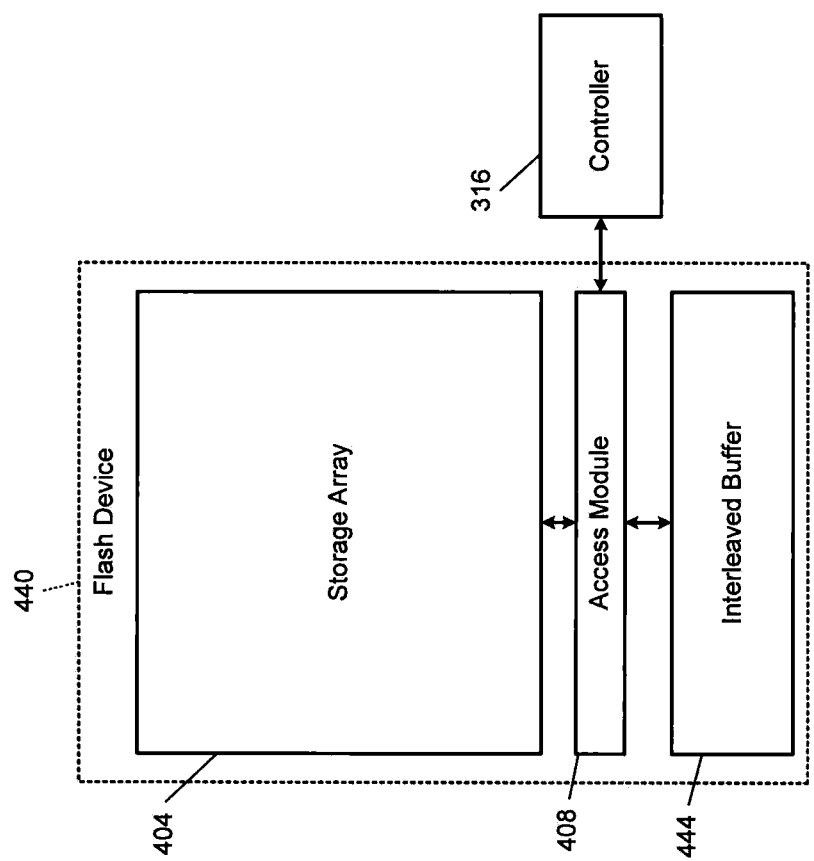

In FIG. 6C, another example flash device 440 includes an interleaved buffer 444, where the hard decisions and soft information may be stored together. The interleaved buffer 444 may also be used when there is no distinction between hard decisions and soft information. For example, a single analog reading (such as current or voltage) may be performed on each storage cell and a multi-bit digitized version of that reading may be stored for the cell. Both hard decisions and soft information may be inferred from the digital reading from the cell.

Figure 6D:
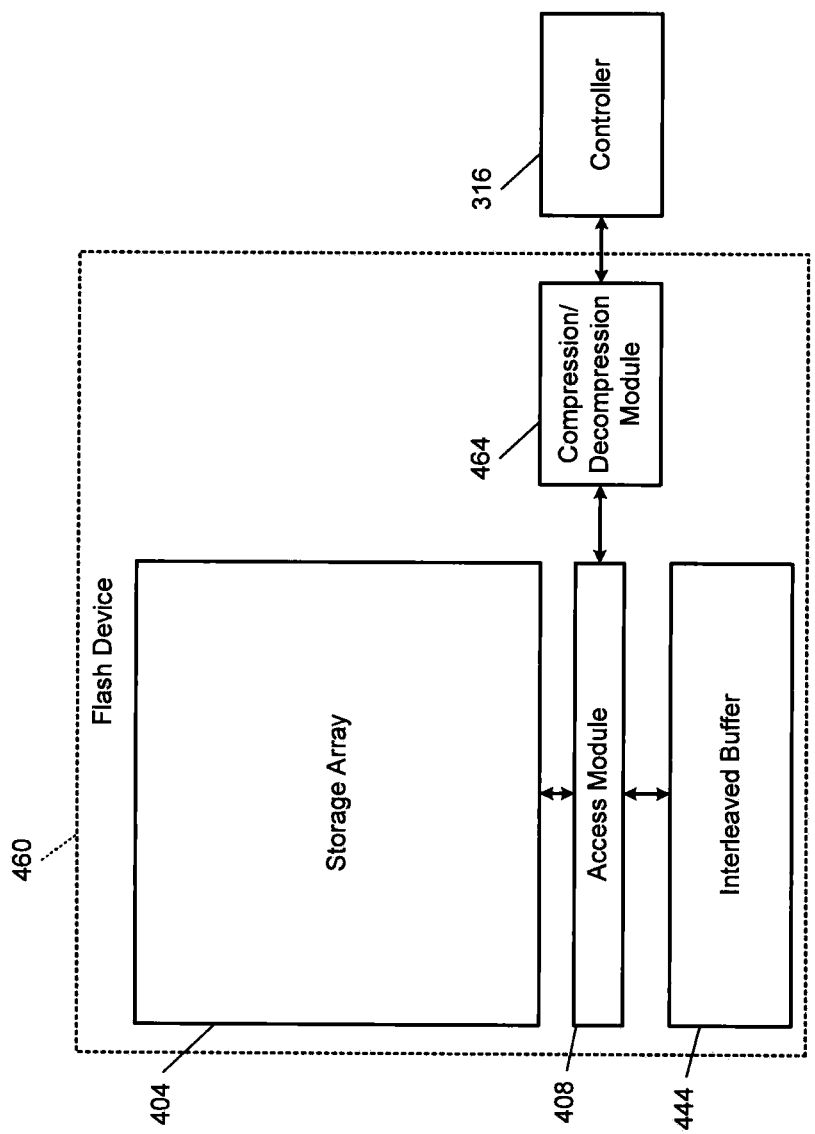

In FIG. 6D, an example flash device 460 includes a compression/decompression module 464. The compression/decompression module 464 may increase throughput on the flash interface to the controller 316, and/or may reduce latency. The compression/decompression module 464 may compress data being sent to the controller 316, and/or may decompress data received from the controller 316.

Although the compression/decompression module 464 is shown with the interleaved buffer 444 of FIG. 6C, the compression/decompression module 464 may be used with any of the flash devices according to the principles of the present disclosure. In addition, although the access module 408 has been shown using the same reference numeral in FIGS. 6A-6D, the access module 408 may be configured appropriately according to whichever buffer configuration is used, and according to whether the compression/decompression module 464 is present. In various other implementations, the access module 408 and the compression/decompression module 464 may be combined.

Figure 7A:
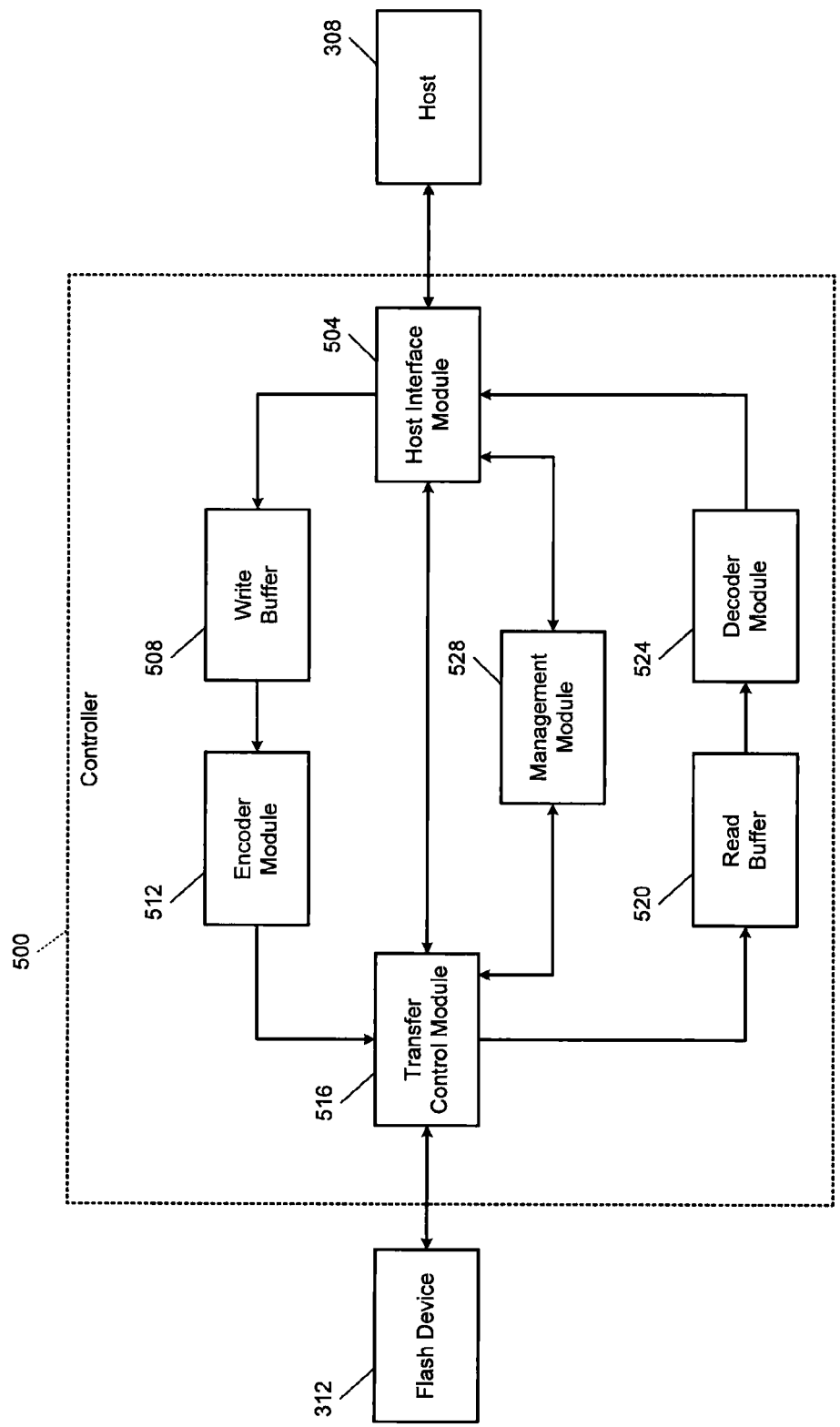
FIGS. 7A-7C are functional block diagrams of an example implementation of a controller for use with a flash system.

In FIG. 7A, an example implementation of a controller 500 includes a host interface module 504 that receives data requests from the host 108. Data requests may include write and read requests. Data to be written is provided to a write buffer 508, where data is stored until the data is ready to be sent to the flash device 312. When the data is ready to be sent, the write buffer 508 provides the write data to an encoder module 512, which applies ECC to the write data. The encoded data is transmitted to the flash device 312 by a transfer control module 516.

The host interface module 504 communicates with the transfer control module 516 to provide read and write requests to the flash device 312. For example, the host interface module 504 may instruct the transfer control module 516 to request a read of data from the flash device 312 and the host interface module 504 may instruct the transfer control module 516 to write data from the write buffer 508 into the flash device 312. Read data supplied in response to a read request is received by the transfer control module 516 from the flash device 312 and stored in a read buffer 520.

In various implementations, the read buffer 520 may be reduced to a size that can only hold the hard decisions and soft information for a single codeword. However, the read buffer 520 may need to be increased in size to accommodate the beginning of a second codeword arriving while the decoding is beginning on the first codeword. Further, in systems where a single decoder serves multiple channels, the channel may be slower than the decoder and therefore more buffers may be needed to keep the decoder active.

A decoder module 524 decodes the data from the read buffer 520. Decoding may include identifying and correcting errors. In various implementations, some detected errors may be uncorrectable, and a corresponding fault may be signaled to the host 108. The fault may be accompanied by the uncorrectable data. Additionally or alternatively, a management module 528 of the controller 500 may take action based on the fault. For example, the management module 528 may re-read the entire page where the fault was found and determine if other faults are present. That page may then be marked as less reliable, which may lead to the management module 528 preventing use of that page for storing data. The management module 528 may also be responsible for implementing wear leveling and establishing a mapping between physical and logical addresses.

Figure 7B:
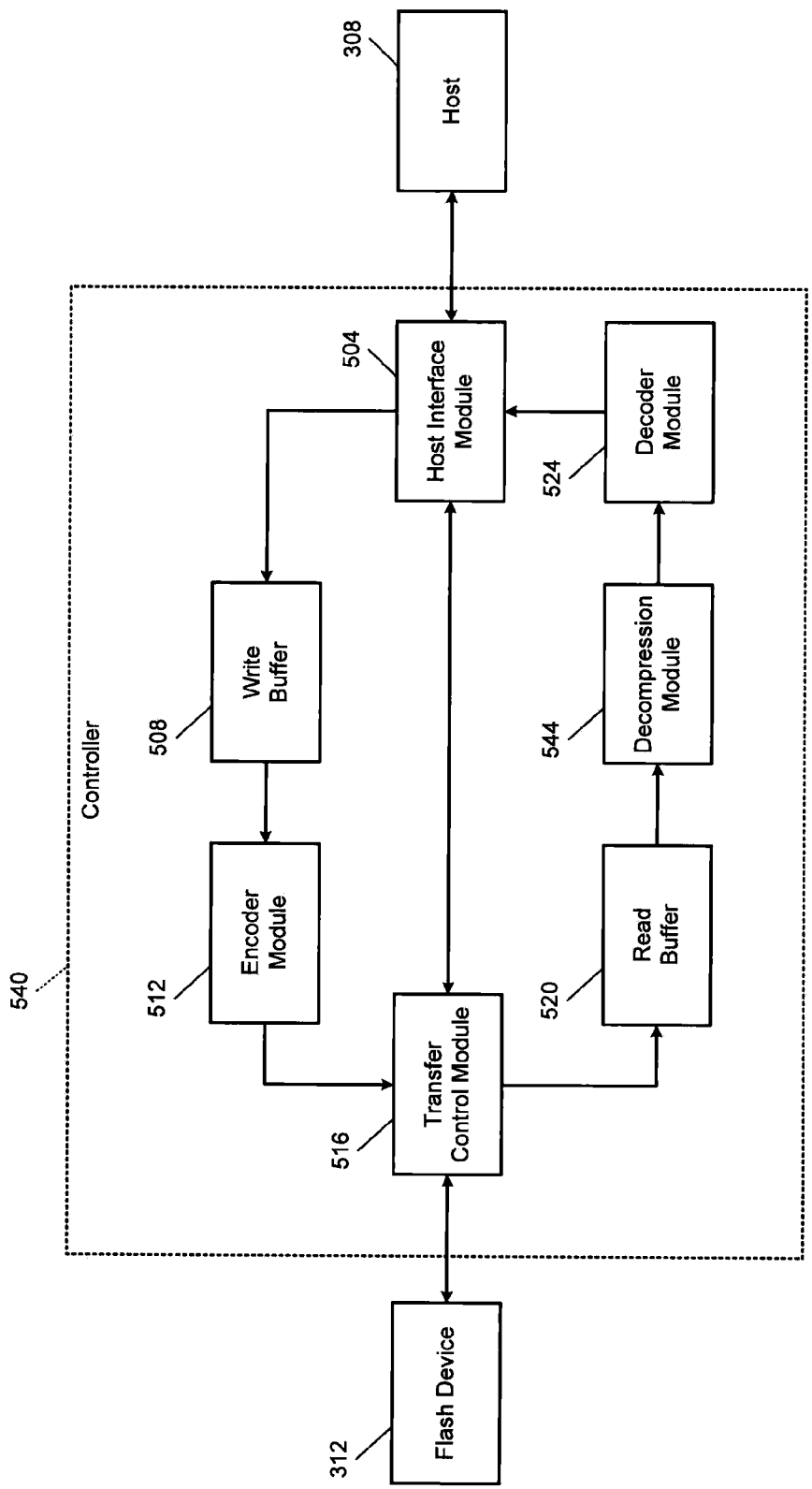

In FIG. 7B, another example implementation of a controller 540 includes a decompression module 544. The decompression module 544 decompresses compressed data sent by the flash device 312 before the decompressed data is decoded by the decoder module 524. In various implementations, the encoder module 512 may be modified to include compression functionality so that data for writing to the flash device 312 is also compressed during transmission.

Figure 7C:
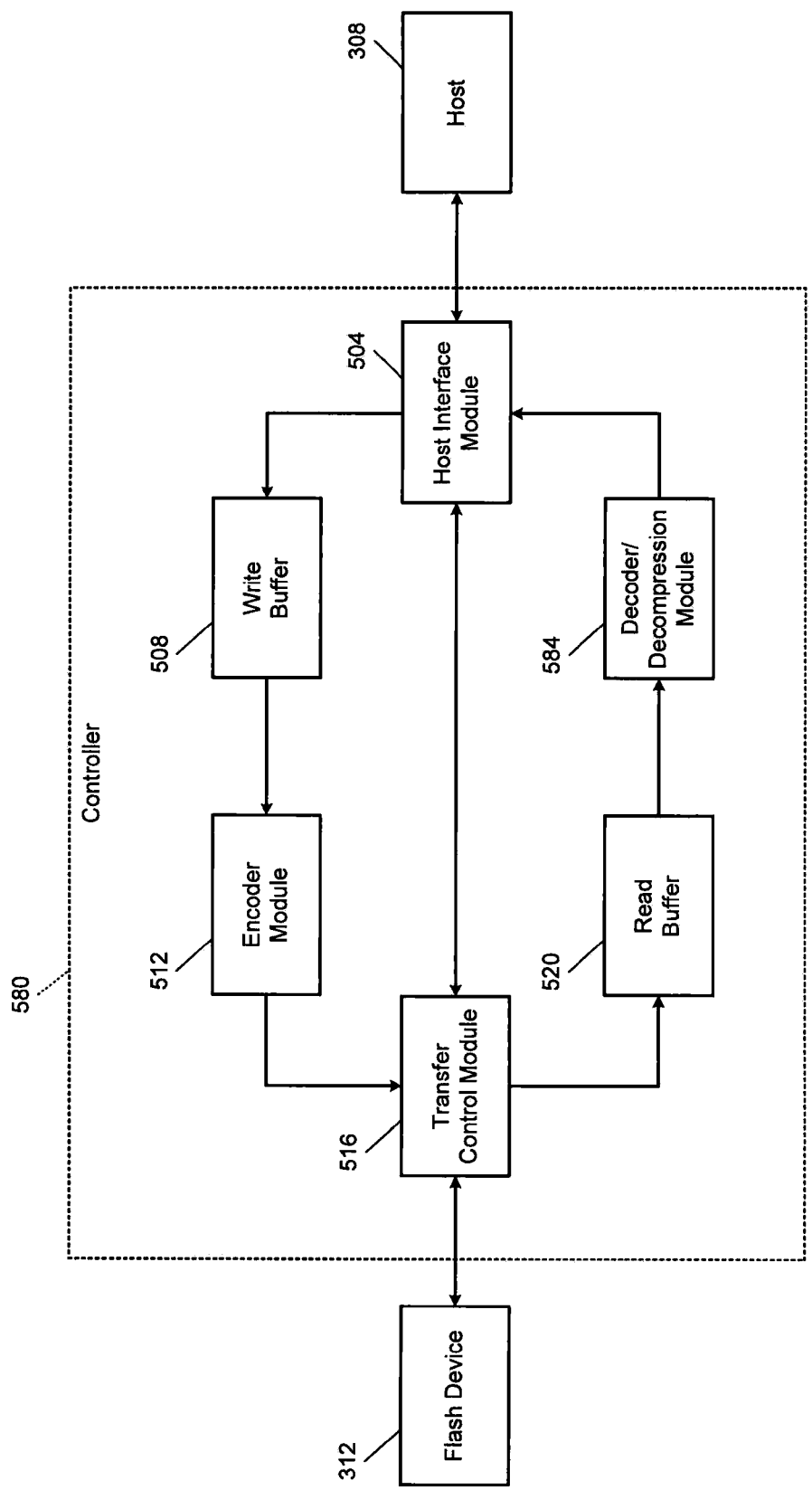

In FIG. 7C, a controller 580 includes a combined decoder/decompression module 584 in place of the decoder module 524 and the decompression module 544 of FIG. 7B. For example, the decoder/decompression module 584 may implement an algorithm that concurrently performs decoding and decompression functions.

Figure 8B:
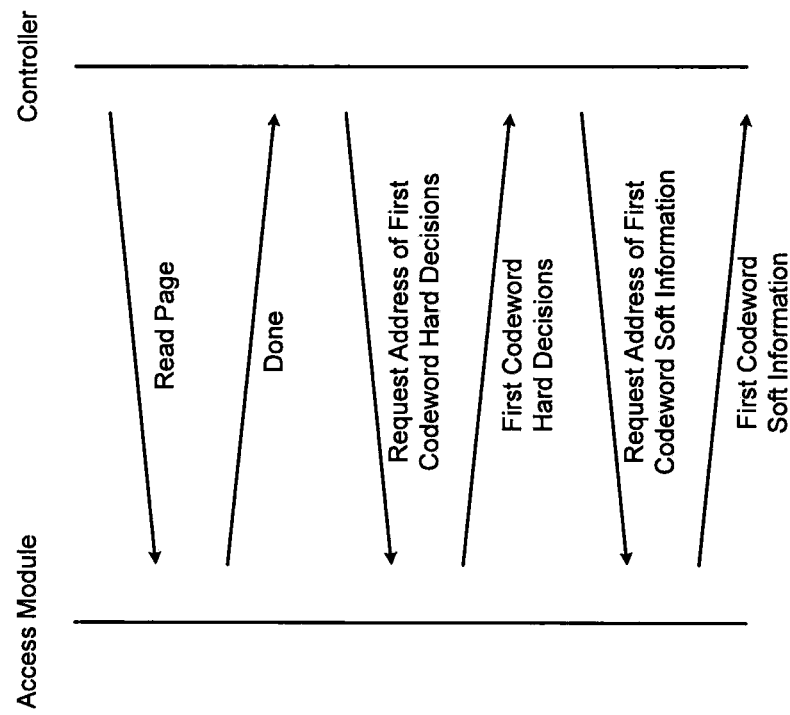
Figure 8A:
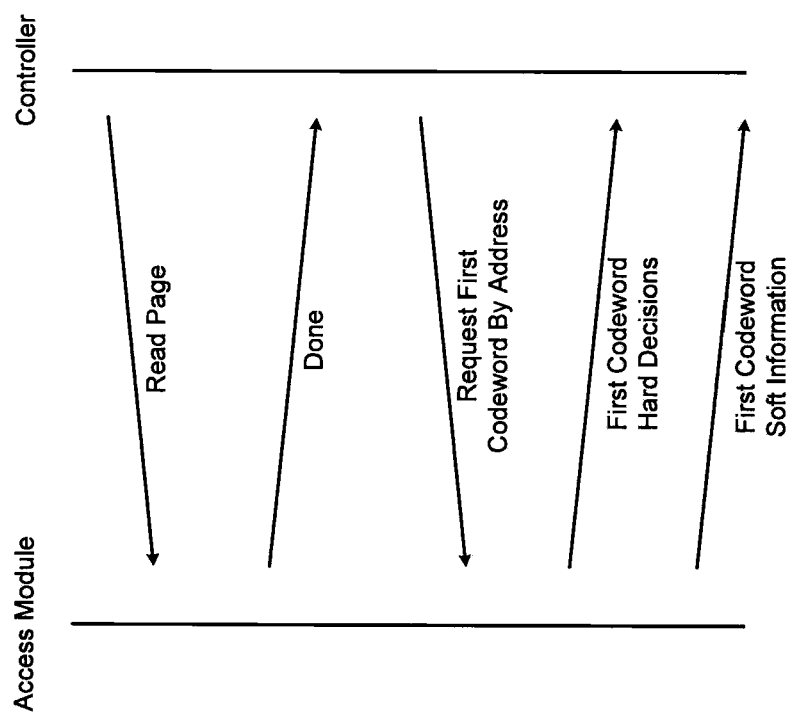

In FIG. 8A, a controller sends a command to an access module to read a page. The access module indicates that the read is done to the controller and, in response, the controller requests a first codeword by address. The address may be absolute within the entire nonvolatile memory, or may be relative to a beginning of the page. The address may also be specified in row-column format based on a physical layout of the storage array 404.

In various implementations, the initial command from the controller may indicate that the controller wants to receive the first codeword, and therefore the access module may send data from the first codeword as soon as the page has been read. In such a case, the separate request from the controller may be omitted. Further, the done indication from the access module to the controller may be omitted in favor of simply beginning to send the data.

The access module first sends hard decisions for the first codeword, and then sends soft information for the first codeword. For simplicity of illustration, the present application describes sending hard decisions prior to soft information for a given codeword. However, the order of the hard decisions and soft information can be reversed as long as (i) the order is prearranged between the access module and the controller or (ii) the character of the data (hard decisions vs. soft information) is conveyed to the controller.

In FIG. 8B, the controller sends a read request, and upon receiving a completion/done indication from the access module, sends a request for hard decisions of the first codeword based on an address at which the hard decisions for the first codeword are stored. For example, the addresses at which the hard decisions are stored may be in a different range than the addresses for soft information. In this way, the controller can express its request for hard decisions and soft information separately. The access module responds to the request with the hard decisions of the first codeword. The controller then requests an address corresponding to soft information of the first codeword. The access module responds with the soft information for the first codeword.

In FIG. 8C, the controller requests a read of a page from the access module. The controller may reference a page by number. Alternatively, the controller may request one or more codewords, and the access module reads the page that contains those codewords. When the page has been read, the controller sends an instruction to the access module to select the hard decisions buffer. This may select a particular buffer or a particular address range within a buffer. The controller then requests the first codeword based on an address of the first codeword. The access module responds with hard decisions for the first codeword because the hard decisions buffer was selected.

The controller then instructs the access module to select the soft information buffer, and again requests the first codeword by address. The access module responds with soft information for the first codeword. Using this approach, an access module that allows for individually selecting hard decisions versus soft information can be used to transfer data according to the present disclosure under control of the controller. As with the implementation of FIG. 8B, the access module need not have been designed or configured according to the principles of the present disclosure. Instead, the controller effects a transfer according to one of the orders shown in FIGS. 5A-5D.

In FIG. 8D, the controller may send an instruction to an appropriately configured access module to send the soft information per codeword. In other words, this instruction will cause the access module to finish sending hard decisions and soft information for a particular codeword before sending hard decisions or soft information for a subsequent codeword. In various implementations, this may be the default and/or only operating mode of the access module. In such a case, this instruction from the controller may be omitted and/or not implemented.

The controller requests a read of a first codeword from the access module. The access module then responds with hard decisions for the first codeword followed by soft information for the first codeword. In various implementations, the read of the first codeword may specify a range of codewords, and may be specified as a location of a first codeword and a count of total number of codewords to be transferred. The access module may be configured to then respond with alternating hard decisions and soft information for each of the codewords specified in the request. The access module may read a first page necessary to satisfy that request, and may read subsequent pages if additional codewords from the subsequent pages are necessary to satisfy the request.

Figure 8E:
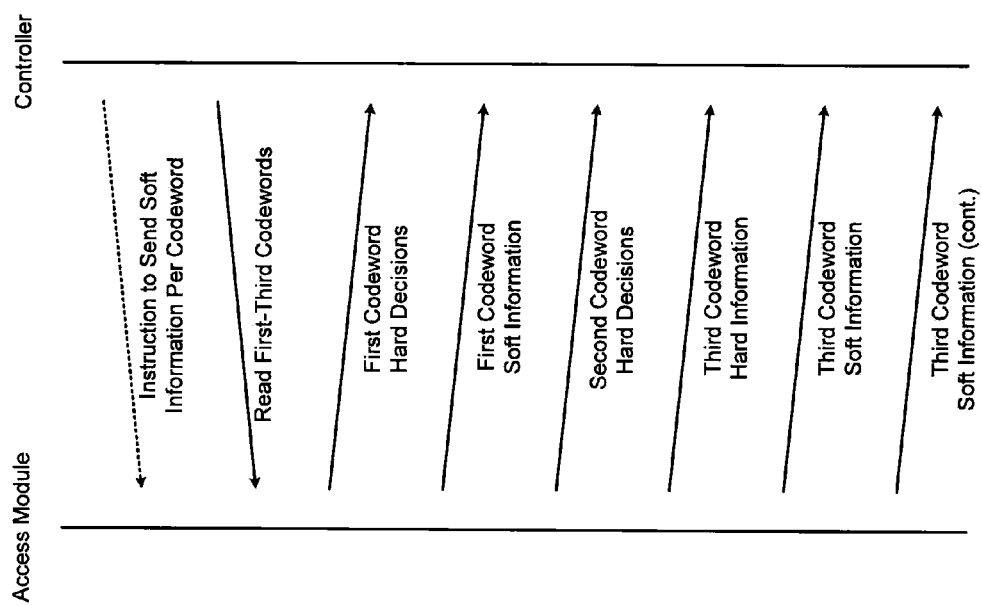

In FIG. 8E, variable amounts of soft information is depicted. In various implementations, different amounts of soft information may be sent for each codeword or groups of codewords. As an example, in FIG. 8E, the second codeword is shown as being sent with any associated soft information. As a result, the hard decisions of the second codeword are immediately followed by the hard decisions of the third codeword. Further, the soft information corresponding to the third codeword is depicted with a continued transmission, indicating that there is more soft information than for the first codeword.

The length of soft information for each codeword may be explicitly transmitted from the access module to the controller. Additionally or alternatively, delimiters (such as predetermined signaling sequences) may be used to indicate when soft information starts and stops. For a codeword with no associated soft information transmitted, the hard decisions of that codeword may be followed immediately by the hard decisions of the subsequent codeword with no soft information delimiters. Instead of omitting the delimiters, a start delimiter may be followed immediately by a stop delimiter, indicating the absence of soft information.

Figure 9A:
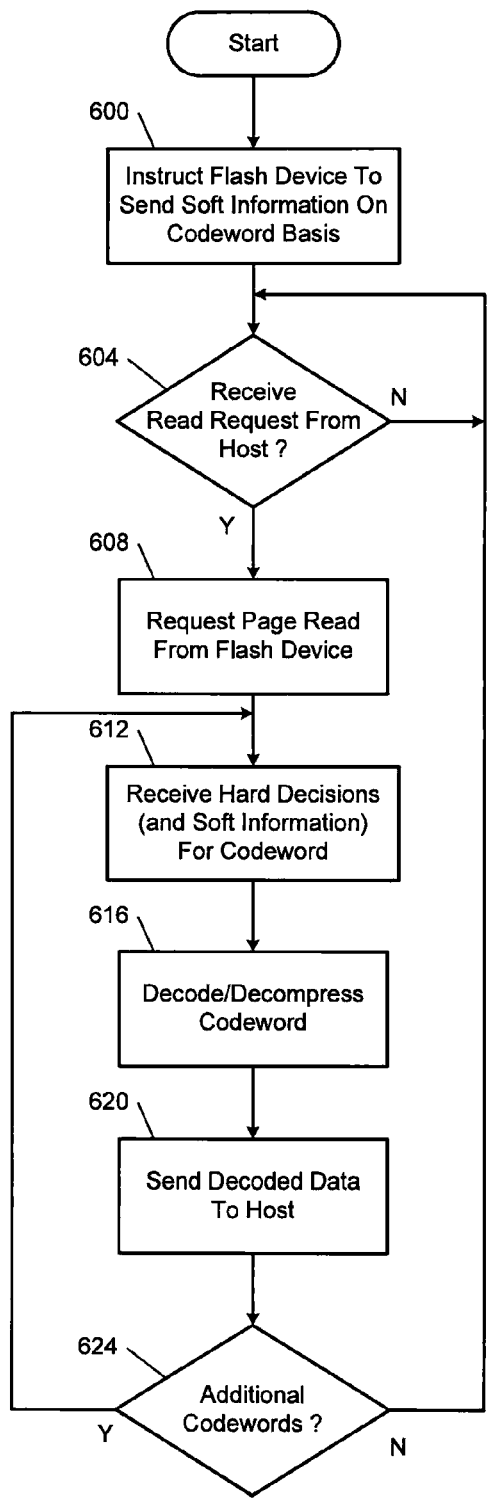
FIGS. 9A-9D are flowcharts depicting example operation of a controller.

In FIG. 9A, example control for a controller begins at 600, where control instructs the flash device to send soft information on a codeword basis. That is, the flash device is instructed to send hard decisions and soft information for a particular codeword without sending any intervening hard decisions or soft information for another codeword. Control continues at 604, where if a read request is received from a host, control transfer to 608; otherwise, control remains at 604.

At 608, control requests a page read from the flash device based on addresses requested by the host. Control continues at 612, where hard decisions (and, if applicable, soft information) are received for a first codeword. At 616, control begins decoding the first codeword because both the hard decisions and soft information are available for the codeword. In various implementations, compressed data from the flash device may also be decompressed. This may happen concurrently with the decoding, or may be performed prior to performing decoding.

Control continues at 620, where the decoded data is sent to the host. At 624, control determines whether additional codewords will be received to satisfy the read request from the host. If so, control returns to 612 to receive hard decisions and soft information for an additional codeword; otherwise, control returns to 604.

Figure 9B:
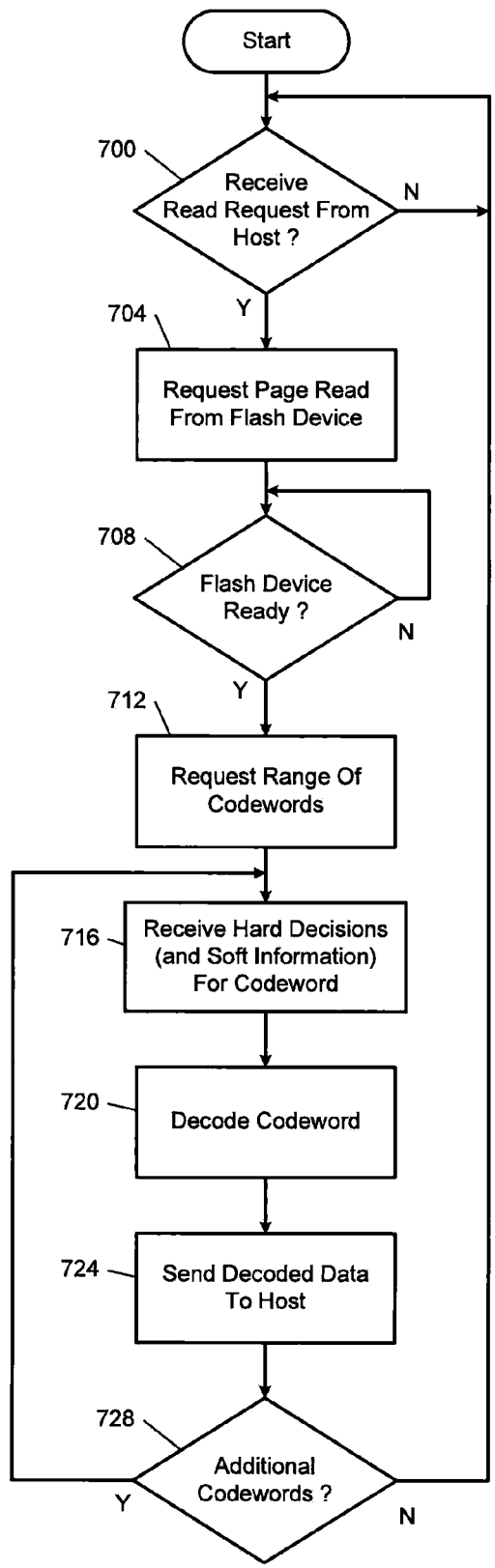

In FIG. 9B, example operation of another controller begins at 700, where if a read request is received from a host, control transfers to 704; otherwise, control remains at 700. At 704, control requests a page read from the flash device. At 708, if the flash device has completed the page read and is ready for data transfer, control transfers to 712; otherwise, control remains at 708. At 712, control requests a range of codewords within the page. At 716, control receives hard decisions (and, if applicable, soft information) for a codeword within the range. At 720, control decodes the data. At 724, the decoded data is sent to the host. At 728, if additional codewords are included within the range, control returns to 716; otherwise, control returns to 700.

Figure 9C:
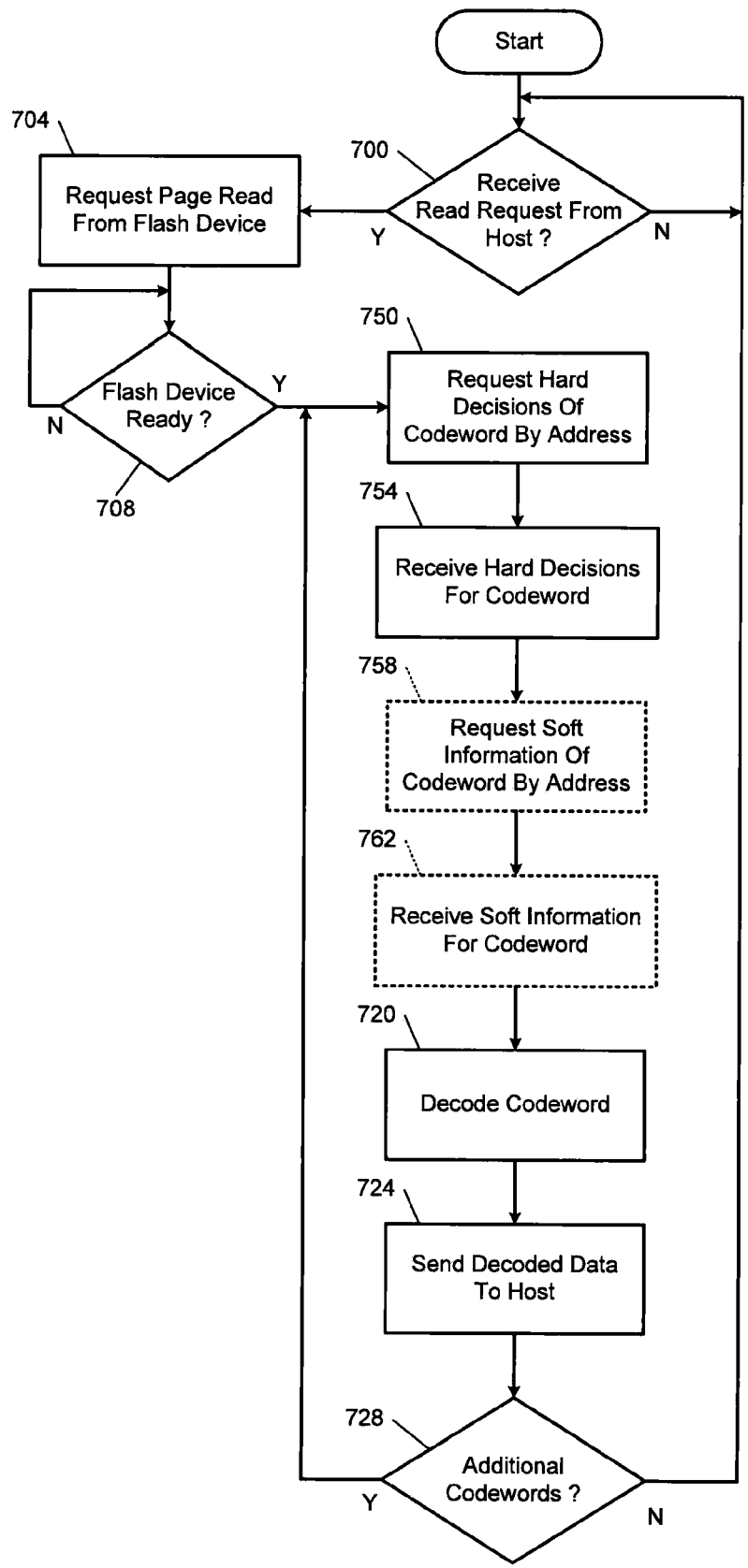

In FIG. 9C, elements similar to those of FIG. 9B are referred to using the same reference numerals. When the flash device is ready at 708, control transfers to 750, where control requests hard decisions of a codeword by the address at which those hard decisions are stored. At 754, control receives and buffers the hard decisions for the codeword. At 758, control requests an address corresponding to soft information of the codeword. At 762, the soft information for the codeword is received, and control continues at 720. Elements 758 and 762 may be skipped for codewords where associated soft information is not needed or required.

Figure 9D:
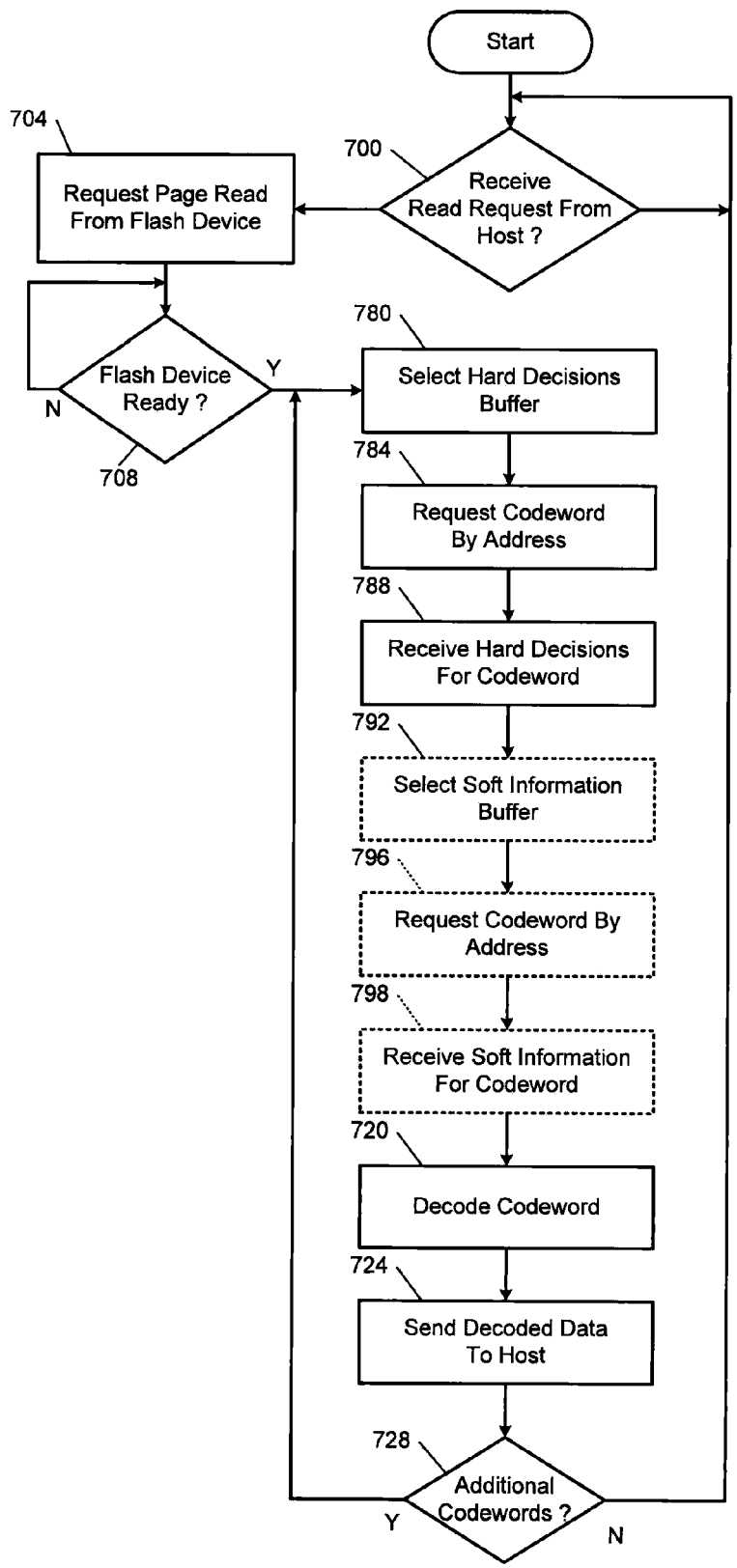

In FIG. 9D, elements similar to those of FIGS. 9B-9C are referred to using the same reference numerals. When the flash device is ready at 708, control transfers to 780, where the buffer corresponding to the hard decisions is selected. At 784, the address of the codeword is requested. At 788, hard decisions for the codeword are received.

At 792, control selects the soft information buffer, and at 796, requests the address of the codeword. At 798, the soft information for the codeword is received, and control continues at 720. Elements 792, 796, and 798 may be skipped for codewords where associated soft information is not needed or required. At 720 in FIGS. 9B-9D, as with 616 of FIG. 9A, decompression may also be performed. Decompression may be performed when the flash device compresses the data for transmission over the flash interface. The decompression may be a separate prior step, or may be performed along with decoding.

Figure 10:
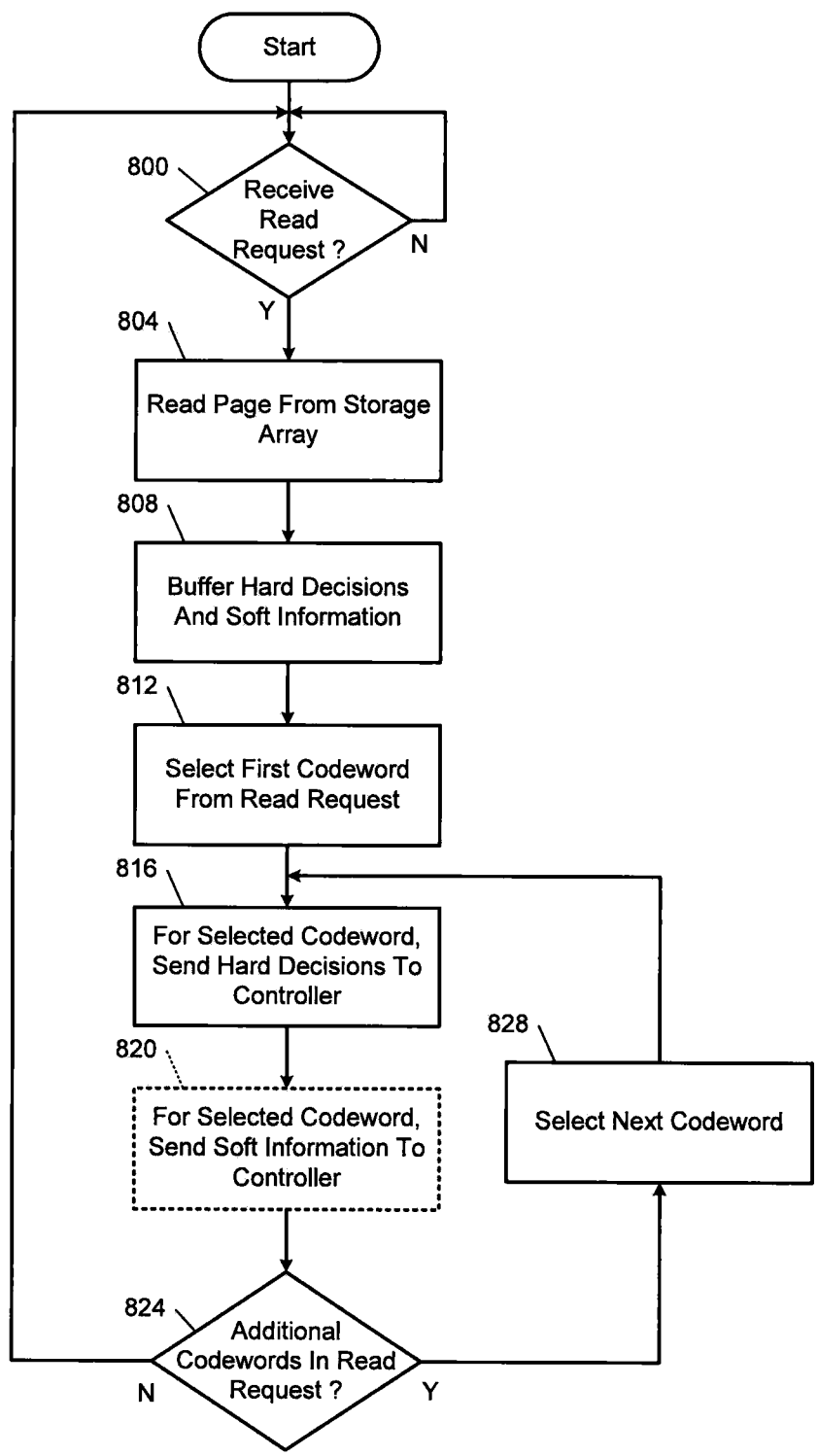
FIG. 10 is a flowchart of example operation of an access module.

In FIG. 10, example operation of a flash device is shown. For example, operation of the flash device may be controlled by an access module within the flash device. Control begins at 800, where if a read request is received from a controller, control transfers to 804; otherwise, control remains at 800. At 804, control reads a page from the storage array that corresponds to the read request. At 808, hard decisions and soft information from the page are buffered. At 812, the first codeword specified in the read request is selected.

Control continues at 816, where, for the selected codeword, hard decisions are sent to the controller. Control continues at 820, where, if applicable, soft information for the selected codeword is sent to the controller. Control continues at 824, where if additional codewords were specified in the read request, control transfers to 828; otherwise, control returns to 800. At 828, control selects the next codeword, and continues at 816.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A controller for a nonvolatile memory device, the controller comprising:
   a transfer control module configured to
      request a read of data from a flash memory module, wherein the data to be read includes data corresponding to a first codeword,
      receive hard decisions corresponding to the first codeword from the flash memory module, and
      receive soft information corresponding to the first codeword from the flash memory module,
      wherein both the hard decisions corresponding to the first codeword and the soft information corresponding to the first codeword are received without receiving any intervening hard decisions or soft information corresponding to another codeword; and
   a decoder module configured to decode the first codeword using (i) the hard decisions corresponding to the first codeword and (ii) the soft information corresponding to the first codeword.

2. The controller of claim 1, wherein the decoder module is configured to begin decoding the first codeword prior to the transfer control module completing reception of hard decisions and soft information corresponding to a second codeword, wherein the second codeword is immediately subsequent to the first codeword.

3. The controller of claim 1 further comprising a buffer configured to store the hard decisions corresponding to the first codeword and the soft information corresponding to the first codeword, wherein a size of the buffer is smaller than a size of all hard decisions for a page of data.

4. The controller of claim 1, wherein the decoder module is configured to begin decoding the first codeword after (i) the hard decisions corresponding to the first codeword and (ii) the soft information corresponding to the first codeword are received.

5. The controller of claim 1, wherein a quantity of the soft information corresponding to the first codeword is an integer multiple of a quantity of the hard decisions corresponding to the first codeword.

6. The controller of claim 1, wherein the transfer control module is configured to:
   select a hard decision buffer of the flash memory module prior to receiving the hard decisions corresponding to the first codeword; and
   select a soft information buffer of the flash memory module prior to receiving soft information corresponding to the first codeword.

7. The controller of claim 6, wherein the transfer control module is configured to:
   upon selecting the hard decision buffer of the flash memory module, request the data corresponding to the first codeword; and
   upon selecting the soft information buffer of the flash memory module, request the data corresponding to the first codeword.

8. The controller of claim 1, wherein the transfer control module is configured to:
   request the data from the flash memory module at an address corresponding to the hard decisions of the first codeword; and
   request the data from the flash memory module at an address corresponding to the soft information of the first codeword.

9. The controller of claim 1, wherein the transfer control module is configured to instruct the flash memory module to transmit both hard decisions of a codeword and soft information of the codeword together without transmitting any intervening hard decisions or soft information corresponding to another codeword.

10. A nonvolatile memory device comprising:
    a storage array of nonvolatile memory cells, wherein the nonvolatile memory cells are grouped into pages;
    a buffer; and
    an access control module configured to selectively (i) write data to a selected page of the pages or (ii) read data from the selected page into the buffer,
    wherein reading data from the selected page includes
       making hard decisions about states of nonvolatile memory cells in the selected page,
       acquiring soft information about the states of the nonvolatile memory cells in the selected page, and
       storing the hard decisions and the soft information into the buffer,
    wherein the selected page includes data corresponding to a plurality of codewords, and
    wherein the access control module is further configured to, for each codeword of the plurality of codewords, output the hard decisions corresponding to the codeword along with any soft information corresponding to the codeword without outputting any intervening hard decisions or soft information for any other ones of the plurality of codewords.

11. The nonvolatile memory device of claim 10, wherein the access control module is configured to read data from the selected page in response to a read request from a controller.

12. The nonvolatile memory device of claim 11, wherein the access control module is configured to identify the selected page in response to the read request, and wherein the access control module is configured to choose a first codeword of the selected page for output according to the read request.

13. A method of operating a controller for a nonvolatile memory device, the method comprising:
    requesting a read of data from a flash memory module, wherein the data to be read includes data corresponding to a first codeword;

receiving hard decisions corresponding to the first codeword from the flash memory module;

receiving soft information corresponding to the first codeword from the flash memory module, wherein both the hard decisions corresponding to the first codeword and the soft information corresponding to the first codeword are received without receiving any intervening hard decisions or soft information corresponding to another codeword; and decoding the first codeword using (i) the hard decisions corresponding to the first codeword and (ii) the soft information corresponding to the first codeword.

14. The method of claim 13 further comprising beginning decoding the first codeword prior to completing reception of hard decisions and soft information corresponding to a second codeword, wherein the second codeword is immediately subsequent to the first codeword.

15. The method of claim 13 further comprising storing the hard decisions corresponding to the first codeword and the soft information corresponding to the first codeword in a buffer, wherein a size of the buffer is smaller than a size of all hard decisions for a page of data.

16. The method of claim 13 further comprising beginning decoding the first codeword after reception is completed of (i) the hard decisions corresponding to the first codeword and (ii) the soft information corresponding to the first codeword.

17. The method of claim 13, wherein a quantity of the soft information corresponding to the first codeword is an integer multiple of a quantity of the hard decisions corresponding to the first codeword.

18. The method of claim 13 further comprising:

selecting a hard decision buffer of the flash memory module prior to receiving the hard decisions corresponding to the first codeword; and selecting a soft information buffer of the flash memory module prior to receiving soft information corresponding to the first codeword.

19. The method of claim 18 further comprising:

upon selecting the hard decision buffer of the flash memory module, requesting the data corresponding to the first codeword; and upon selecting the soft information buffer of the flash memory module, requesting the data corresponding to the first codeword.

20. The method of claim 13 further comprising:

requesting the data from the flash memory module at an address corresponding to the hard decisions of the first codeword; and requesting the data from the flash memory module at an address corresponding to the soft information of the first codeword.

21. The method of claim 13, further comprising:

instructing the flash memory module to transmit both hard decisions of a codeword and soft information of a codeword together without transmitting any intervening hard decisions or soft information corresponding to another codeword.

22. A method of operating a nonvolatile memory device including a buffer and a storage array of nonvolatile memory cells, wherein the nonvolatile memory cells are grouped into pages, the method comprising:

in response to a write request for a selected page, writing data to the selected page;

in response to a read request for the selected page, making hard decisions about states of nonvolatile memory cells in the selected page, acquiring soft information about the states of the nonvolatile memory cells in the selected page, and storing the hard decisions and the soft information into the buffer, wherein the selected page includes data corresponding to a plurality of codewords; and for each codeword of the plurality of codewords, outputting the hard decisions corresponding to the codeword along with any soft information corresponding to the codeword without outputting any intervening hard decisions or soft information for any other ones of the plurality of codewords.

23. The method of claim 22 further comprising:

identifying the selected page in response to the read request; and choosing a first codeword of the selected page for output according to the read request.

* * * * *